United States Patent [19]

Shinada et al.

[11] Patent Number: 5,094,967
[45] Date of Patent: Mar. 10, 1992

[54] METHOD FOR MANUFACTURING SEMICONDUCTOR DEVICE HAVING A NON-VOLATILE MEMORY CELL AND LOGIC REGIONS BY USING A CVD SECOND INSULATING FILM

[75] Inventors: Kazuyoshi Shinada, Yokohama; Masayuki Yoshida, Kawasaki; Takahide Mizutani; Naoki Hanada, both of Yokohama, all of Japan

[73] Assignee: Kabushiki Kaisha Toshiba, Kawasaki, Japan

[21] Appl. No.: 620,701

[22] Filed: Dec. 3, 1990

[30] Foreign Application Priority Data

Dec. 6, 1989 [JP] Japan ................. 1-315156

[51] Int. Cl.$^5$ .............................. H01L 21/265
[52] U.S. Cl. ........................ 437/43; 437/49; 437/52; 148/DIG. 138
[58] Field of Search ............... 437/52, 49, 43, 41, 437/51, 225, 977; 148/DIG. 106, DIG. 138

[56] References Cited

U.S. PATENT DOCUMENTS

| | | | |
|---|---|---|---|
| 4,131,497 | 12/1978 | Feng et al. | 437/31 |
| 4,295,265 | 10/1987 | Horiuchi et al. | 437/41 |
| 4,517,732 | 5/1985 | Oshikawa | 437/52 |
| 4,584,027 | 4/1986 | Metz, Jr. et al. | 437/41 |
| 4,597,159 | 7/1986 | Usami et al. | 148/DIG. 138 |
| 4,764,479 | 8/1988 | Kosa et al. | 437/52 |

OTHER PUBLICATIONS

Wolf, Stanley, & Tauber, Richard N. Silicon Processing for the VLSI ERA, vol. I, Lattice Press, (1986).
Shinada et al., J. Electrochemical society, vol. 132, No. 9, p. 2185 (1985), "Reduction in Polysilicon Oxide Leakage Current by Annealing Prior to Oxidation".

Primary Examiner—Brian E. Hearn
Assistant Examiner—C. Chaudhari
Attorney, Agent, or Firm—Finnegan, Henderson, Farabow, Garrett and Dunner

[57] ABSTRACT

A method for manufacturing a semiconductor substrate device having a non-volatile memory cell region and a logic region including MOS transistors. A first insulating film and a first electrode layer are formed on a semiconductor substrate. Only those portions of the first insulating film and first electrode layer which are located in the logic region are removed, without removing those portions of the first insulating film and first electrode layer which are located in the non-volatile memory cell region. A sacrificial film is deposited for insulation over the entire surface of the memory cell region and logic region, and then a resist film is coated on the sacrificial film. Subsequently, impurity ions are implanted into a desired channel region located in the logic region. The resist film and sacrificial film are removed, and thereafter a second insulating film and a second electrode layer are formed.

2 Claims, 2 Drawing Sheets

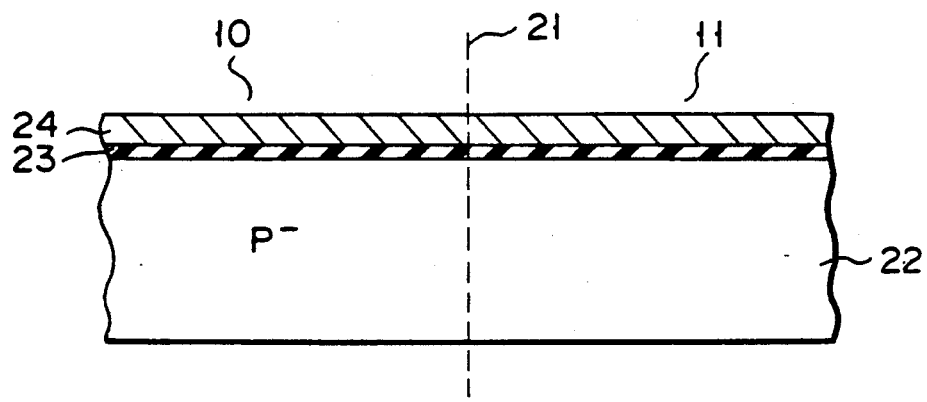
F I G. 1A
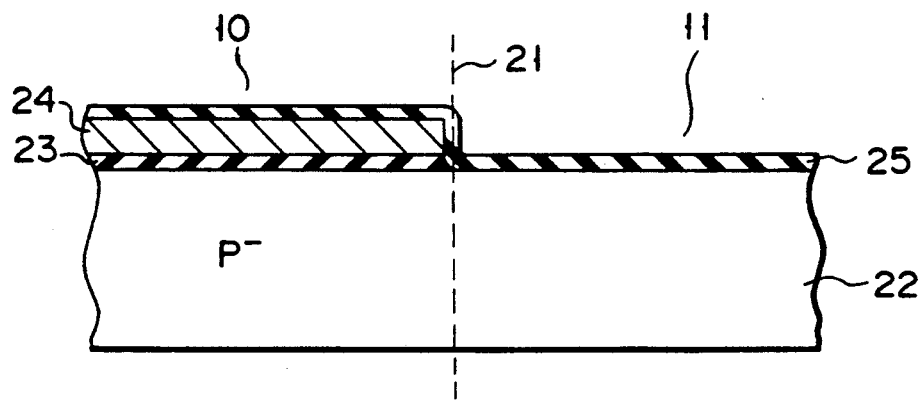
F I G. 1B
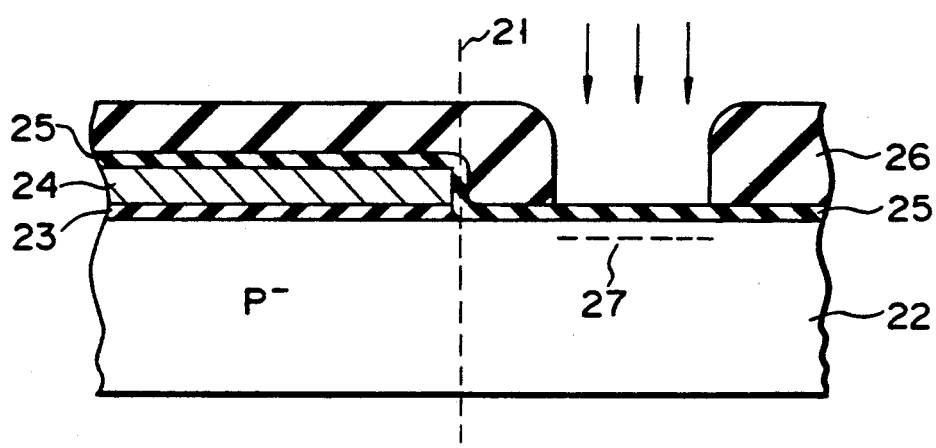
F I G. 1C

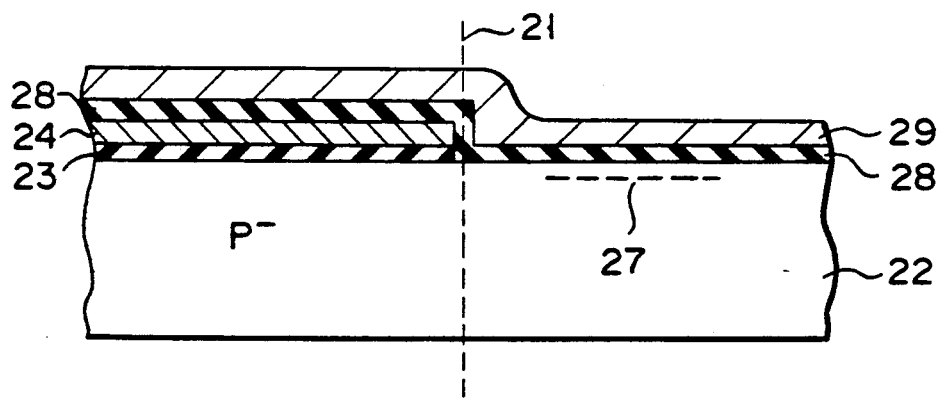
F I G. 1D
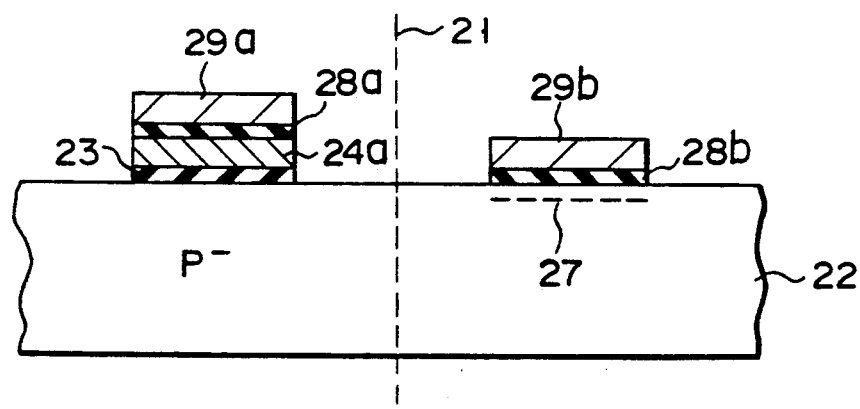
F I G. 1E
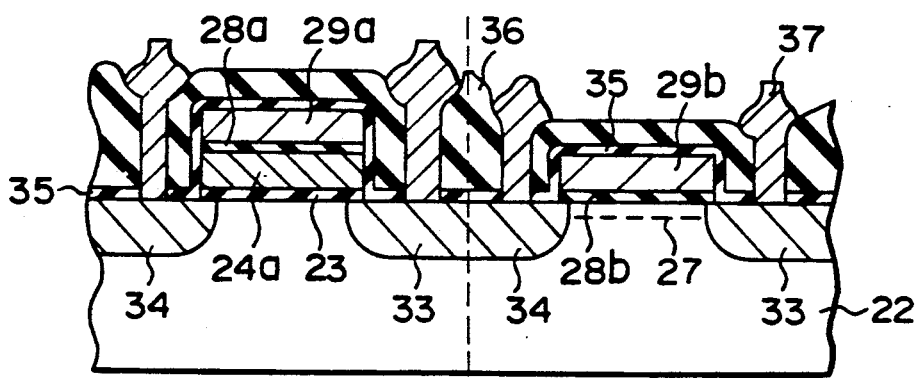
F I G. 1F

5,094,967

METHOD FOR MANUFACTURING SEMICONDUCTOR DEVICE HAVING A NON-VOLATILE MEMORY CELL AND LOGIC REGIONS BY USING A CVD SECOND INSULATING FILM

BACKGROUND OF THE INVENTION

1. Field of the Invention

This invention relates to a method for manufacturing a semiconductor device having a non-volatile memory cell region and a logic region including MOS transistors.

2. Description of the Related Art

A conventional method for manufacturing a semiconductor device having a non-volatile memory cell region and a logic region including MOS transistors will now be explained.

First, to form a first insulating film and a first polysilicon film in the memory cell region, a gate oxide film is formed over a semiconductor wafer or substrate by thermal oxidization, and then a polysilicon film is deposited on the oxide film.

Subsequently, only those portions of the gate oxide film and polysilicon film which are located in the logic region are removed from the wafer. Then, another insulating film is formed all over the wafer by thermal oxidization. A resist film is directly coated on the insulating film. Thereafter, an opening is formed in a desired portion of the resist film, through which impurity ions are implanted into the substrate of the logic region, thereby forming the channel region of a MOS transistor. The resist film is then removed, and a second polysilicon film is deposited over the memory cell region and logic region.

Thereafter, predetermined portions of the memory cell region and logic region are subjected to self-align dry etching, thus forming a memory cell and MOS transistors constituting a logic circuit, respectively.

However, this method has the following disadvantages:

1. Due to the process of implanting impurity ions into the logic region through the gate oxide film, the gate film is charged with part of the impurity ions, and traps are formed therein. Thus, the gate threshold voltage Vth of the MOSFET is unstable.

2. To implant impurity ions into the channel region of the logic region, the resist film is directly formed on a poly-poly insulating film (an insulating film formed between a floating gate and a control gate) in the non-volatile memory cell region, and on the gate oxide film in the logic region. This causes part of the resist film to remain as a pollutant in the poly-poly insulating film and in the gate oxide film.

SUMMARY OF THE INVENTION

It is the object of the invention to provide a method for manufacturing a superior semiconductor device having a non-volatile memory cell of high quality, and MOS transistors of high reliability constituting a logic circuit.

To attain the object, the method for manufacturing a semiconductor device having a non-volatile memory cell region and a logic region including MOS transistors, comprises the steps of: forming a first insulating film and a first electrode layer on a semiconductor substrate; removing the first insulating film and first electrode layer which are located in the logic region, without removing the first insulating film and first electrode layer which are located in the non-volatile memory cell region; forming a deposited sacrificial film for insulation over the entire surface of the memory cell region and logic region; and coating a resist film on the sacrificial film; forming an opening in a desired portion of the resist film, and implanting impurity ions into the semiconductor substrate located in the logic region through the opening; removing the resist film and sacrificial film, and forming a second insulating film and a second electrode layer over the non-volatile memory cell region and logic region.

According to the method, the resist film is coated after the sacrificial film is formed over the entire surface of the non-volatile memory cell region and logic region. Subsequently, impurity ions are implanted only into a desired channel region of the logic region, then the resist film and sacrificial film are removed, and a gate oxide film is formed.

This being so, the traps or the like will not be formed in the gate insulating film of the MOS transistors, and also a fluctuation in the gate threshold voltage Vth of the transistor will not occur. Further, part of the resist film, acting as a pollutant, does not remain in the poly-poly insulating film and gate oxide film, which are important elements for the operation of the non-volatile memory cell and MOS transistors. As a result, these films are enhanced in reliability.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIGS. 1A through 1F show a flowchart, useful in explaining a manufacturing method of a semiconductor device according to an embodiment of the present invention.

DETAILED DESCRIPTION OF THE PREFERRED EMBODIMENT

The method of this invention will be explained in detail with reference to the accompanying drawings showing an embodiment thereof.

FIGS. 1A-1F show a semiconductor device having an EPROM and MOS transistors. In the figures, broken line 21 is a boundary which defines a non-volatile memory cell region 10 and a logic region 11.

Referring first to FIG. 1A, a first gate oxide film 23 having a thickness of 250 Å is formed on a P$^-$ type silicon semiconductor substrate 22 by thermal oxidization. Then, a first polysilicon film 24 is formed on the first gate oxide film 23 by CVD (Chemical Vapor Deposition). Subsequently, those portions of the oxide film 23 and polysilicon film 24 which located in the logic region 11 are removed by CDE (Chemical Dry Etching) or RIE (Reactive Ion Etching).

Thereafter, as is shown in FIG. 1B, an oxide film 25 having a thickness of 250 Å is deposited by CVD, over the first polysilicon film 24 in the memory cell region 10 and the P⁻ silicon substrate 22 in the logic region, thereby protecting them from contamination caused by a resist film to be formed later, or ions to be implanted later. The film 25 is a deposited sacrificial oxide film for insulation.

Referring to FIG. 1C, a resist film 26 is formed on the oxide film 25, and then an opening is formed in the resist film 26 at a desired location in the logic region 11, through the opening impurity ions are implanted, thereby forming a channel region 27. After removing the resist film 26, the oxide film 25 is also removed by etching in NH₄F solution, which prevents the material of the resist film from remaining in the semiconductor integrated circuit. Heat process can be applied to the wafer in non-oxidizing atmosphere to electrically activate the impurity ions after removing the resist film 26. If the resist material remains in the circuit, the material is scattered therein during heating etc. performed later, which may deteriorate the quality of the device.

Subsequently, as is shown in FIG. 1D, a second gate oxide film 28 is formed by thermal oxidation at 900°-1000° C. in the atmosphere of oxygen, and a second polysilicon film 29 having a thickness of 0.4 μm is deposited on the film 28. Then, as is shown in FIG. 1E, that portion of the second polysilicon film 29 located in the non-volatile memory cell region 10 and the remaining first polysilicon film 24 are subjected to self align dry etching, thereby forming a non-volatile memory cell comprising a control gate 29a and a floating gate 24a. On the other hand, that portion of the second polysilicon film 29 located in the logic region 11 is subjected to dry etching, thereby forming a gate electrode 29b.

Referring to FIG. 1F, impurity ions are implanted into the substrate, forming N⁺ type drain regions 33 and N⁺ type source regions 34 for the MOS transistors in the logic region 11, and for the EPROM in the non-volatile memory cell region 10, respectively. Thereafter, an oxide film 35 and a passivation film 36 are provided on the chip. Contact holes are formed in the films 35 and 36, through which Al wiring 37 is formed.

As is described above, the deposited sacrificial oxide film for protecting the first polysilicon film and P⁻ type silicon semiconductor substrate, is formed by CVD, in order that the surface of first polysilicon film 24, which serves as the floating gate 24a of the non-volatile memory cell, may not be oxidized. If the sacrificial layer is formed by thermal oxidization (usually performed at 800°-1000° C.), the polysilicon film 24 must be subjected to high heat thermal oxidization twice, which may emphasize the asperity of the surface of the film 24, thereby decreasing the breakdown voltage of a cell and hence the reliability thereof. Consequently, it is more desirable to deposit the sacrificial oxide layer through a process performed at low temperature such that oxidation may be suppressed, than by thermal oxidization performed at high temperature.

Though the sacrificial oxide film is formed by CVD in the embodiment, it can be deposited by any other process, if the process is performed at low temperature. Further, this film can be an insulating film made of a material other than an oxide.

Moreover, the embodiment employs N-channel MOSs, but it can employ P-channel MOSs or complementary MOSs. The present invention can be applied to an EEPROM, a non-volatile memory cell of another type, or a flash EEPROM (which allows one-time erasure of the EEPROM).

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method for manufacturing a semiconductor device having a non-volatile memory cell region and a logic region including MOS transistors, comprising the steps of:

forming a first insulating film and a first electrode layer on a semiconductor substrate including the memory cell region and the logic region;

removing the first insulating film and first electrode layer which are on the logic region, without removing the first insulating film and first electrode layer on the non-volatile memory cell region;

forming a sacrificial film for insulation over the entire surface of the logic region and the memory cell region without oxidation of the first electrode layer; and coating a resist film on the sacrificial film;

forming an opening in a portion of the resist film on the logic region, and implanting impurity ions into the logic region through the opening; and removing the resist film and sacrificial film, and forming a second insulating film and a second electrode layer over the non-volatile memory cell region and the logic region.

2. The method according to claim 1, wherein the sacrificial film is an insulating film formed by chemical vapor deposition.

* * * * *